(12) United States Patent
Sato (10) Patent No.: US 6,504,599 B2
(45) Date of Patent: Jan. 7, 2003

(54) STAGE APPARATUS, EXPOSURE APPARATUS, AND DEVICE MANUFACTURING METHOD

(75) Inventor: Mikio Sato, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/879,193

(22) Filed: Jun. 13, 2001

(65) Prior Publication Data

US 2001/0052970 A1 Dec. 20, 2001

(30) Foreign Application Priority Data

Jun. 16, 2000 (JP) ........................................ 2000-180792

(51) Int. Cl.$^7$ ........................ G03B 27/58; G03B 27/42; G03C 5/00; A61N 5/00; F16M 11/24
(52) U.S. Cl. ........................... 355/72; 355/53; 355/55; 355/62; 355/68; 355/72; 355/77; 430/311; 430/312; 250/492.2; 250/492.22; 248/188.2; 248/638
(58) Field of Search .............................. 355/53, 55, 56, 355/62, 68, 72, 73, 77; 430/311, 312; 250/492.2, 492.22; 248/638, 188.2

(56) References Cited

U.S. PATENT DOCUMENTS

| | | | | |
|---|---|---|---|---|
| 5,780,943 A | * | 7/1998 | Ono | |
| 5,806,193 A | * | 9/1998 | Ebihara | |
| 6,036,162 A | * | 3/2000 | Hayashi | |
| 6,130,517 A | * | 10/2000 | Yuan et al. | |
| 6,265,758 B1 | * | 7/2001 | Takahashi | |

* cited by examiner

*Primary Examiner*—Russell Adams
*Assistant Examiner*—Khaled Brown
(74) *Attorney, Agent, or Firm*—Fitzpatrick, Cella, Harper & Scinto

(57) ABSTRACT

A stage apparatus includes a stage, a member fixed to the stage and a weight compensation mechanism having at least three spring members for compensating for a weight of a structure including the stage and the member. A barycentric position of the structure deviates from a centroid of a polygon formed by support points of the at least three spring members. The spring constants of the at least three spring members are based on a relative positional relationship between the barycentric position of the structure and the at least three spring members so as to set at least one spring constant different from the other spring constants.

46 Claims, 6 Drawing Sheets

STAGE APPARATUS, EXPOSURE APPARATUS, AND DEVICE MANUFACTURING METHOD

FIELD OF THE INVENTION

The present invention relates to a stage apparatus used for, e.g., a fine moving stage for finely aligning a substrate such as a wafer or a master such as a reticle in an exposure apparatus or the like, an exposure apparatus, and a device manufacturing method.

BACKGROUND OF THE INVENTION

Control techniques for industrial and information devices are increasing in precision and speed as such devices become complicated, advanced, and miniaturized. Exposure apparatuses for manufacturing "semiconductor devices" which support various types of such devices are also rapidly increasing in speed and precision, and demands are arising for nm-order alignment precision and the like.

A generally known alignment mechanism for a wafer and reticle in an exposure apparatus is a stage apparatus constituted by a fine moving stage having a microtranslation mechanism and fine rotation mechanism, and a coarse moving stage having a large-stroke moving mechanism in the translational direction.

Such an exposure apparatus finely aligns, controls, and exposes a wafer or reticle on the fine moving stage so as to make it coincide with the image or object plane by the fine moving stage mounted on the coarse moving stage while the coarse moving stage makes large-stroke movement.

In general, both the coarse and fine moving stages often use linear motors, which utilize a Lorentz force, as the actuator of the alignment mechanism.

However, the fine moving stage of the exposure apparatus has recently been found to suffer from the following problems.

(1) As chips, wafers, and reticles increase in size, the fine moving stage also increases in size. Pushing up the fine moving stage by a linear motor using a Lorentz force consumes a large amount power.

Especially the actuator of the fine moving stage is often attached near a wafer or reticle. Compared to the coarse moving stage, the fine moving stage greatly influences the wafer or reticle to thermally deform it, resulting in very low final exposure precision.

(2) Demands are arising for a high-speed exposure apparatus, and the acceleration of the coarse moving stage is being increased. This means that the acceleration applied from the coarse moving stage to the fine moving stage also increases. When the coarse moving stage accelerates the fine moving stage, a moment force proportional to the acceleration of the coarse moving stage acts on the fine moving stage due to the difference between the barycenter of the fine moving stage and a "point of application" where the actuator of the coarse moving stage pushes the fine moving stage.

Hence, as the speed increases, the actuator of the fine moving stage becomes bulky in order to withstand the moment force, and the amount of heat generated by the actuator increases to adversely influence the exposure precision. In other words, a bulky actuator increases heat, which is a vicious cycle.

As a means for solving these problems, there is provided a method of compensating for the weight of the fine moving stage by using the repulsion and attraction forces of a magnet or electromagnet. In this case, it is difficult to hold the posture of the fine moving stage by compensation with only the magnet, so a spring is also used to hold the posture.

Figure 5A:
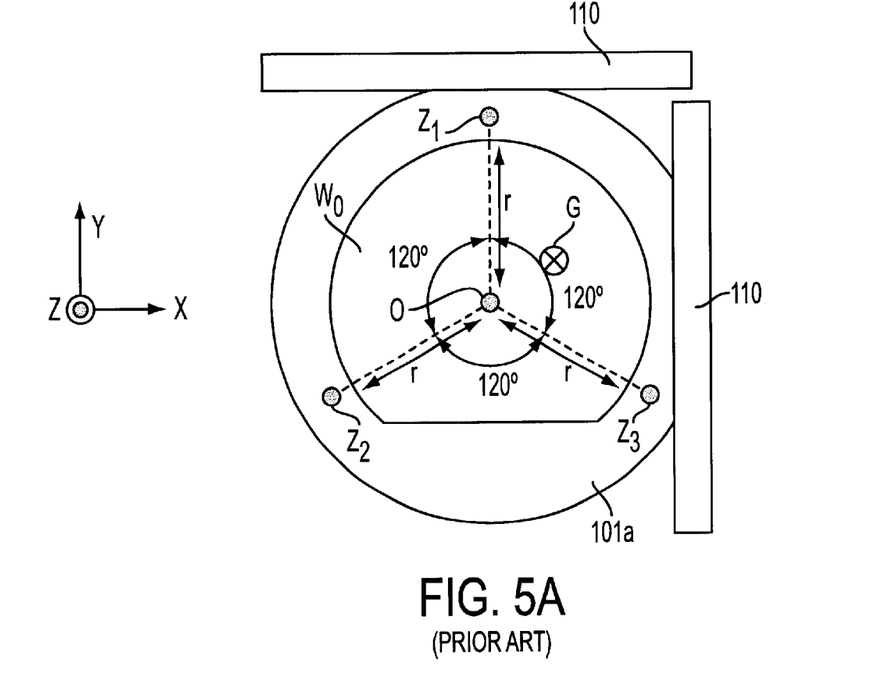
FIGS. 5A and 5B are a plan view and sectional view, respectively, showing a conventional stage apparatus.
Figure 5B:
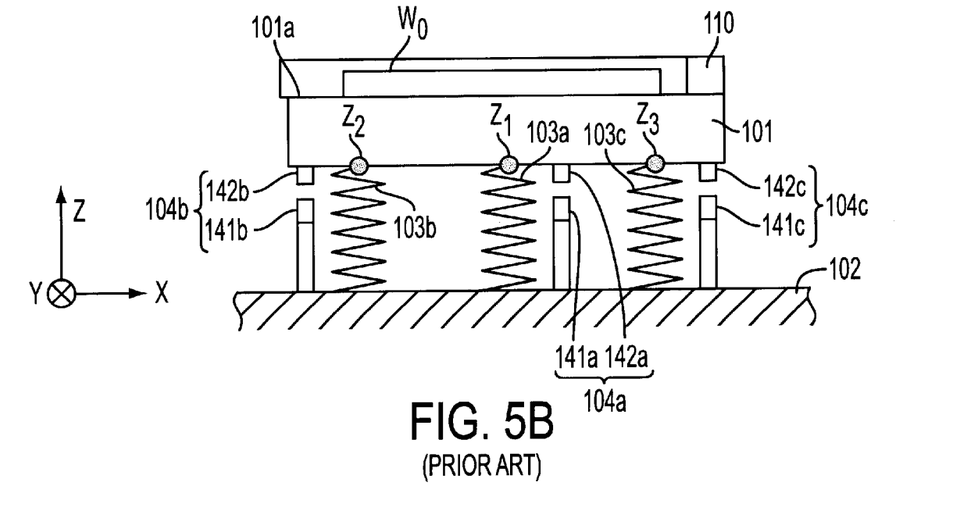

FIGS. 5A and 5B schematically show a conventional wafer stage for compensating for the weight by magnetic repulsion. This wafer stage comprises a fine moving stage 101 having a support surface 101a for supporting a wafer W0, a coarse moving stage 102 having a large-stroke moving mechanism (not shown), first to third spring members 103a to 103c for holding the posture of the fine moving stage 101 on the coarse moving stage 102, and first to third magnetic units 104a to 104c for compensating for the weight by a so-called magnetic repulsion force for supporting the weight of the fine moving stage 101. The magnetic units 104a to 104c are respectively made up of magnets 141a to 141c fixed to the upper surface of the coarse moving stage 102 and magnets 142a to 142c fixed to the lower surface of the fine moving stage 101 so as to face the corresponding magnets 141a to 141c.

The weight of the fine moving stage 101 is compensated for by the magnetic repulsion forces of the magnets 141a to 141c and 142a to 142c of the magnetic units 104a to 104c. When the wafer W0 is aligned near the image plane of a projection optical system (not shown), the weight of the fine moving stage 101 is canceled by the magnetic repulsion force.

The three spring members 103a to 103c for compensating for the posture of the fine moving stage 101 have the same spring constant, which is set to minimize the restoring forces of the springs while the wafer W0 is near the image plane.

The fine moving stage 101 has a pair of bar mirrors 110 for detecting the position of the fine moving stage 101 by a laser interferometer or the like. This wafer stage is equipped with a control system for feeding back the detected position information of the fine moving stage 101 to the actuator of the coarse moving stage 102.

The three posture compensation spring members 103a to 103c are generally arranged at positions Z1 to Z3 at equal intervals of 120° on a circle of a radius r having a geometrical center O of the fine moving stage 101 as its center.

In this prior art, however, the barycenter of a structure formed from the members and fine moving stage is at a position different from the geometrical center of the fine moving stage, i.e., the geometrical centroid of a triangle formed by the support points Z1 to Z3 of the spring members 103a to 103c under the influence of the members such as the bar mirrors fixed to the fine moving stage for holding a wafer. The restoring forces of the three spring members necessary for pushing up the fine moving stage only in the +Z direction without rotating it and for keeping it at a predetermined pushed-up position and posture are different.

Accordingly, holding the posture by the three springs having the same spring constant causes the following problems even if the magnets compensate for the weight of the fine moving stage. Assume that the fine moving stage is vertically displaced in the −Z direction without rotating it, and the springs uniformly deflect. In this case, the sum of the restoring forces of the three springs not only translates the fine moving stage in the +Z direction but also rotates it.

More specifically, if an external force acts on the fine moving stage owing to some factor while position control by the actuator of the fine moving stage stops, or if position control stops due to an emergency stop caused by an accident while the fine moving stage is displaced in the −Z direction by the actuator, restoring motion of the fine moving stage in the +Z direction and tilt motion exceeding a moving stroke in the rotational direction occur, scoring or damaging the stage.

There is proposed a method of compensating for the weight of the fine moving stage by magnets, compensating for the posture by springs, and generating a uniform weight compensation force by the magnets in almost the entire range of the Z-direction stroke on the fine moving stage. Even this method requires a posture holding means using coil springs or leaf springs because compensation by only magnets is unstable. This method cannot solve the static unbalance.

There is also proposed a method of directly compensating for the weight of the fine moving stage by springs. Even this method cannot solve the above problems.

SUMMARY OF THE INVENTION

The present invention has been made to overcome the conventional drawbacks, and has as its object to provide a stage apparatus which uses at least three spring members in order to compensate for the weight of a stage for setting a wafer or reticle, can improve the stability of a compensation function by the spring members, and can effectively avoid scoring of or damage to the stage, to provide an exposure apparatus including the stage, and to provide a method of manufacturing a device by using the exposure apparatus.

To achieve the above object, according to the present invention, there is provided a stage apparatus comprising:
  a stage;
  a member fixed to said stage; and
  a weight compensation mechanism having at least three spring members for compensating for a weight of a structure including said stage and said member, a barycentric position of the structure deviating from a centroid of a polygon formed by support points of the at least three spring members,
    wherein spring constants of the at least three spring members are determined based on a relative position relationship between the barycentric position of the structure and the at least three spring members so as to set at least one spring constant different from the other spring constants.

According to a preferred embodiment of the present invention, it is preferable that the at least three spring members include coil springs.

According to a preferred embodiment of the present invention, it is preferable that the at least three spring members include air cylinders.

According to a preferred embodiment of the present invention, it is preferable that the at least three spring members include leaf springs.

According to a preferred embodiment of the present invention, it is preferable that the weight compensation mechanism further includes a magnet.

According to a preferred embodiment of the present invention, it is preferable that the apparatus further comprises an actuator for vertically driving said stage.

According to a preferred embodiment of the present invention, it is preferable that the actuator includes a linear motor.

According to a preferred embodiment of the present invention, it is preferable that the apparatus further comprises at least three actuators for vertically driving said stage, wherein a supporting force generated by each of the spring members and applied to said stage and a driving force generated by each of the actuators and applied to said stage are exerted on the same axis.

According to a preferred embodiment of the present invention, it is preferable that the member includes a mirror.

According to a preferred embodiment of the present invention, it is preferable that the at least three spring members are arranged at positions a constant distance from the geometrical center of said stage.

According to a preferred embodiment of the present invention, it is preferable that the at least three spring members include n spring members, and the n spring members are arranged at vertexes of a regular n-side polygon having the geometrical center of said stage as a center.

According to the present invention, there is provided a stage apparatus comprising:
  a stage;
  a member fixed to said stage; and
  a weight compensation mechanism having at least three spring members for compensating for a weight of a structure including said stage and said member, a barycentric position of the structure deviating from a centroid of a polygon formed by support points of the at least three spring members,
    wherein spring constants of the at least three spring members are determined to make application points of restoring forces of the at least three spring members coincide with the barycentric position of the structure when said stage is statically balanced.

According to the present invention, there is provided a stage apparatus comprising:
  a coarse moving stage;
  a fine moving stage mounted on said coarse moving stage;
  a member fixed to said fine moving stage; and
  a weight compensation mechanism which has at least three spring members for compensating for a weight of a structure including said fine moving stage and said member and is interposed between said coarse moving stage and said fine moving stage, a barycentric position of the structure deviating from a centroid of a polygon formed by support points of the at least three spring members,
    wherein spring constants of the at least three spring members are determined based on a relative positional relationship between the barycentric position of the structure and the at least three spring members so as to set at least one spring constant different from the other spring constants.

According to the present invention, there is provided a stage apparatus comprising:
  a coarse moving stage;
  a fine moving stage mounted on said coarse moving stage;
  a member fixed to said fine moving stage; and
  a weight compensation mechanism which has at least three spring members for compensating for a weight of a structure including said fine moving stage and said member and is interposed between said coarse moving stage and said fine moving stage, a barycentric position of the structure deviating from a centroid of a polygon formed by support points of the at least three spring members,
    wherein spring constants of the at least three spring members are determined to make application points of restoring forces of the at least three spring members coincide with the barycentric position of the structure when said stage is statically balanced.

According to the present invention, there is provided an exposure apparatus comprising:
  an illumination system for illuminating a master;
  a master stage apparatus which moves while supporting the master;

a projection optical system for projecting a pattern of the master onto a substrate; and a substrate stage apparatus which moves while supporting the substrate, at least one of said master and substrate stage apparatuses having a stage, a member fixed to said stage, and a weight compensation mechanism having at least three spring members for compensating for a weight of a structure including said stage and said member, a barycentric position of the structure deviating from a centroid of a polygon formed by support points of the at least three spring members, wherein spring constants of the at least three spring members are determined based on a relative positional relationship between the barycentric position of the structure and the at least three spring members so as to set at least one spring constant different from the other spring constants.

According to the present invention, there is provided an exposure apparatus comprising:

an illumination system for illuminating a master;

a master stage apparatus which moves while supporting the master;

a projection optical system for projecting a pattern of the master onto a substrate; and a substrate stage apparatus which moves while supporting the substrate, at least one of said master and substrate stage apparatuses having a stage, a member fixed to said stage, and a weight compensation mechanism having at least three spring members for compensating for a weight of a structure including said stage and said member, a barycentric position of the structure deviating from a centroid of a polygon formed by support points of the at least three spring members, wherein spring constants of the at least three spring members are determined to make application points of restoring forces of the at least three spring members coincide with the barycentric position of the structure when said stage is statically balanced.

According to the present invention, there is provided an exposure apparatus comprising:

a projection optical system for projecting an image onto a substrate; and a substrate stage apparatus which moves while supporting the substrate, said substrate stage apparatus having a stage, a member fixed to said stage, and a weight compensation mechanism having at least three spring members for compensating for a weight of a structure including said stage and said member, a barycentric position of the structure deviating from a centroid of a polygon formed by support points of the at least three spring members, wherein spring constants of the at least three spring members are determined based on a relative positional relationship between the barycentric position of the structure and the at least three spring members so as to set at least one spring constant different from the other spring constants.

According to the present invention, there is provided an exposure apparatus comprising:

a projection optical system for projecting an image onto a substrate; and a substrate stage apparatus which moves while supporting the substrate, said substrate stage apparatus having a stage, a member fixed to said stage, and a weight compensation mechanism having at least three spring members for compensating for a weight of a structure including said stage and said member, a barycentric position of the structure deviating from a centroid of a polygon formed by support points of the at least three spring members, wherein spring constants of the at least three spring members are determined to make application points of restoring forces of the at least three spring members coincide with the barycentric position of the structure when said stage is statically balanced.

According to the present invention, there is provided a device manufacturing method comprising the steps of:

exposing a photosensitive agent on a substrate by using an exposure apparatus; and developing the photosensitive agent on the substrate, the exposure apparatus having an illumination system for illuminating a master, a master stage apparatus which moves while supporting the master, a projection optical system for projecting a pattern of the master onto a substrate, and a substrate stage apparatus which moves while supporting the substrate, at least one of the master and substrate stage apparatuses having a stage, a member fixed to the stage, and a weight compensation mechanism having at least three spring members for compensating for a weight of a structure including the stage and the member, a barycentric position of the structure deviating from a centroid of a polygon formed by support points of the at least three spring members, wherein spring constants of the at least three spring members are determined based on a relative position relationship between the barycentric position of the structure and the at least three spring members so as to set at least one spring constant different from other spring constants.

According to the present invention, there is provided a device manufacturing method comprising the steps of:

exposing a photosensitive agent on a substrate by using an exposure apparatus; and developing the photosensitive agent on the substrate, the exposure apparatus having an illumination system for illuminating a master, a master stage apparatus which moves while supporting the master, a projection optical system for projecting a pattern of the master onto a substrate, and a substrate stage apparatus which moves while supporting the substrate, at least one of the master and substrate stage apparatuses having a stage, a member fixed to the stage, and a weight compensation mechanism having at least three spring members for compensating for a weight of a structure including the stage and the member, a barycentric position of the structure deviating from a centroid of a polygon formed by support points of the at least three spring members, wherein spring constants of the at least three spring members are determined to make application points of restoring forces of the at least three spring members coincide with the barycentric position of the structure when the stage is statically balanced.

According to the present invention, there is provided a device manufacturing method comprising the steps of:

exposing a photosensitive agent on a substrate by using an exposure apparatus; and developing the photosensitive agent on the substrate, the exposure apparatus having a projection optical system for projecting an image onto a substrate, and a substrate stage apparatus which moves while supporting the substrate, the substrate stage apparatus having a stage, a member fixed to the stage, and a weight compensation mechanism having at least three spring members for compensating for a weight of a structure including the stage and the member, a barycentric position of the structure deviating from a centroid of a polygon formed by support points of the at least three spring members, wherein spring constants of the at least three spring members are determined based on a relative position relationship between the barycentric position of the structure and the at least three spring members so as to set at least one spring constant different from other spring constants.

According to the present invention, there is provided a device manufacturing method comprising the steps of:

exposing a photosensitive agent on a substrate by using an exposure apparatus; and developing the photosensitive agent on the substrate, the exposure apparatus having a projection optical system for projecting an image onto a substrate, and a substrate stage apparatus which moves while supporting the substrate, the substrate stage apparatus having a stage, a member fixed to the stage, and a weight compensation mechanism having at least three spring members for compensating for a weight of a structure including the stage and the member, a barycentric position of the structure deviating from a centroid of a polygon formed by support points of the at least three spring members, wherein spring constants of the at least three spring members are determined to make application points of restoring forces of the at least three spring members coincide with the barycentric position of the structure when the stage is statically balanced.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described with reference to the accompanying drawings.

Figure 1A:
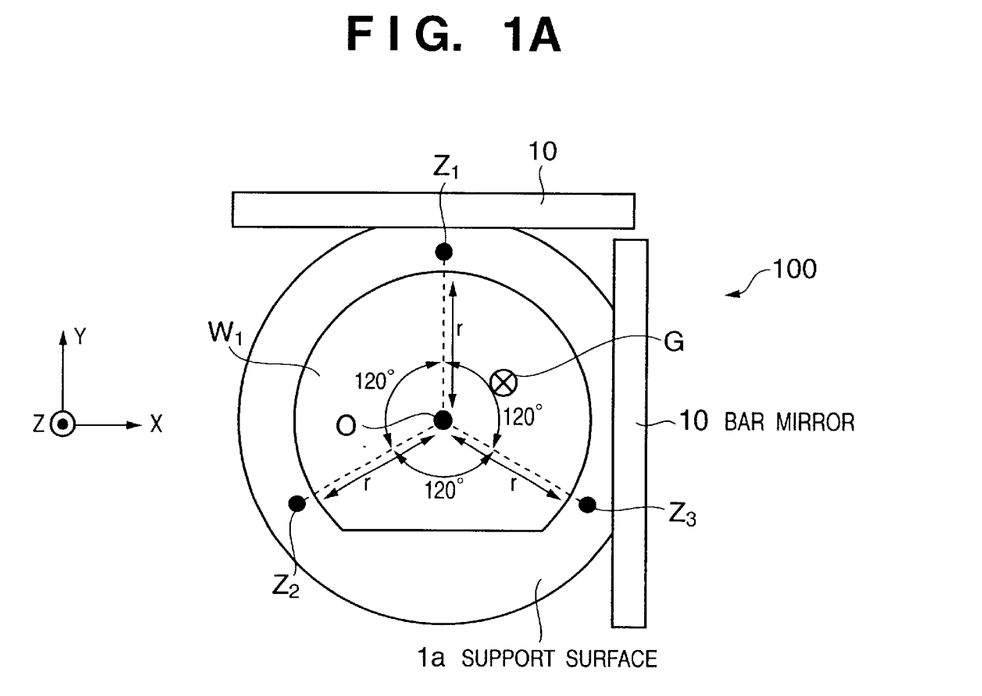
FIGS. 1A and 1B are a plan view and sectional view, respectively, showing the stage apparatus of an exposure apparatus according to the first embodiment of the present invention.
Figure 1B:
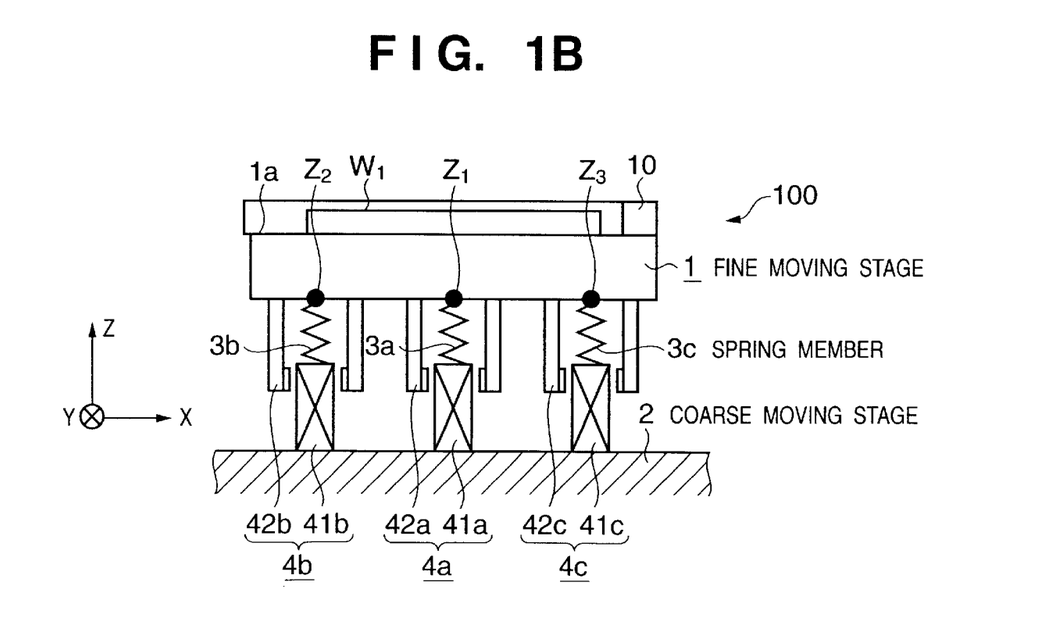

FIGS. 1A and 1B show the stage apparatus of an exposure apparatus according to the first embodiment of the present invention. A stage apparatus 100 comprises a fine moving stage 1 having a support surface 1a for supporting a wafer W1 serving as a substrate or a reticle serving as a master, a coarse moving stage 2 having a large-stroke moving mechanism (not shown), first to third spring members 3a to 3c serving as a weight compensation mechanism interposed between the coarse moving stage 2 and the fine moving stage 1, and linear motors 4a to 4c serving as first to third actuators. The linear motors 4a to 4c are respectively made up of stationary members 41a to 41c fixed to the upper surface of the coarse moving stage 2 and movable members 42a to 42c fixed to the lower surface of the fine moving stage 1 so as to face the corresponding stationary members 41a to 41c.

The vertical position of the fine moving stage 1 is controlled by a Lorentz force applied between the stationary members 41a to 41c and movable members 42a to 42c of the linear motors 4a to 4c, and the wafer W1 is aligned near the image plane of a projection optical system (not shown). At this time, the weight of the fine moving stage 1 is canceled by the three spring members 3a to 3c, and the posture of the fine moving stage 1 is also compensated for by the three spring members 3a to 3c.

The fine moving stage 1 has a pair of bar mirrors 10 for detecting the position of the fine moving stage 1 by a laser interferometer or the like. This wafer stage is equipped with a control system for feeding back the position information of the fine moving stage 1 to the actuator (not shown) of the coarse moving stage 2.

The first to third spring members 3a to 3c support the fine moving stage 1 at positions (vertexes of a regular triangle having a center O) Z1 to Z3 at angles of 120° on a circle of a radius r having a geometrical center O of the fine moving stage 1 as its center. A barycenter G of a structure formed from the fine moving stage 1 and bar mirrors 10 deviates from the geometrical center O of the fine moving stage 1 (centroid of a rectangular triangle Z1Z2Z3) in the +X and +Y directions under the influence of the bar mirrors 10.

As far as the three spring members 3a to 3c have the same spring constant, the sum of the restoring forces of the spring members 3a to 3c which support the fine moving stage 1 at the equal-interval positions Z1 to Z3 at angles of 120° on the circle of the radius r having the geometrical center O as its center acts at the geometrical center O, generating a rotation moment around the barycenter G of the fine moving stage 1.

To prevent tilt of the fine moving stage 1 caused by the rotation moment, the ratio of the spring constants of the three spring members 3a to 3c is calculated from the relative positional relationship between the positions Z1 to Z3 and the barycenter G in FIG. 1A so as to make the application point of the sum of the restoring forces of the spring members 3a to 3c coincide with the barycenter G of the fine moving stage 1 when the linear motors 4a to 4c are not driven and the fine moving stage 1 is statically balanced. The spring constants of the spring members 3a to 3c are set to satisfy this ratio and set displacement of the fine moving stage 1 by its weight to a proper amount.

When the barycenter G is at the position shown in FIG. 1A, spring constants k1, k2, and k3 of the spring members 3a, 3b, and 3c that are set based on the relative positions of the first to third spring members 3a to 3c to the barycenter G satisfy k1>k3>k2.

The first to third linear motors 4a to 4c control the position of the fine moving stage 1 in the Z translation (vertical), pitching, and rolling directions on the basis of outputs from position sensors (not shown) for measuring Z-direction displacements of the fine moving stage 1 near the points Z1 to Z3. A driving force generated by each of the linear motors 4a to 4c and applied to the fine moving stage 1 and a supporting force generated by each of the springs 3a to 3c and applied to the stage 1 are exerted on the same axis when viewed from the vertical direction. Each of the linear motors and the corresponding spring are located serially in the vertical direction.

According to the first embodiment, the linear motors 4a to 4c of the fine moving stage 1 suffice to generate a force against a moment force caused by a deviation of the barycenter G from the geometrical center O during acceleration/deceleration of the coarse moving stage 2. Compared to gravity compensation by the Lorentz force, the amount of heat generated by the linear motors 4a to 4c can be greatly suppressed.

According to the first embodiment, scoring of or damage to the stage upon weight compensation by spring members having the same spring constant, like the prior art, can be effectively prevented even if an external force acts on the fine moving stage owing to some factor while the servomotor of the fine moving stage fails, or even if position control stops due to emergency stop while the fine moving stage is pushed down in the –Z direction by position control of the linear motor in wafer exchange or the like.

Note that the spring members may be leaf springs or the like, other than the coil springs shown in FIG. 1B.

Figure 2A:
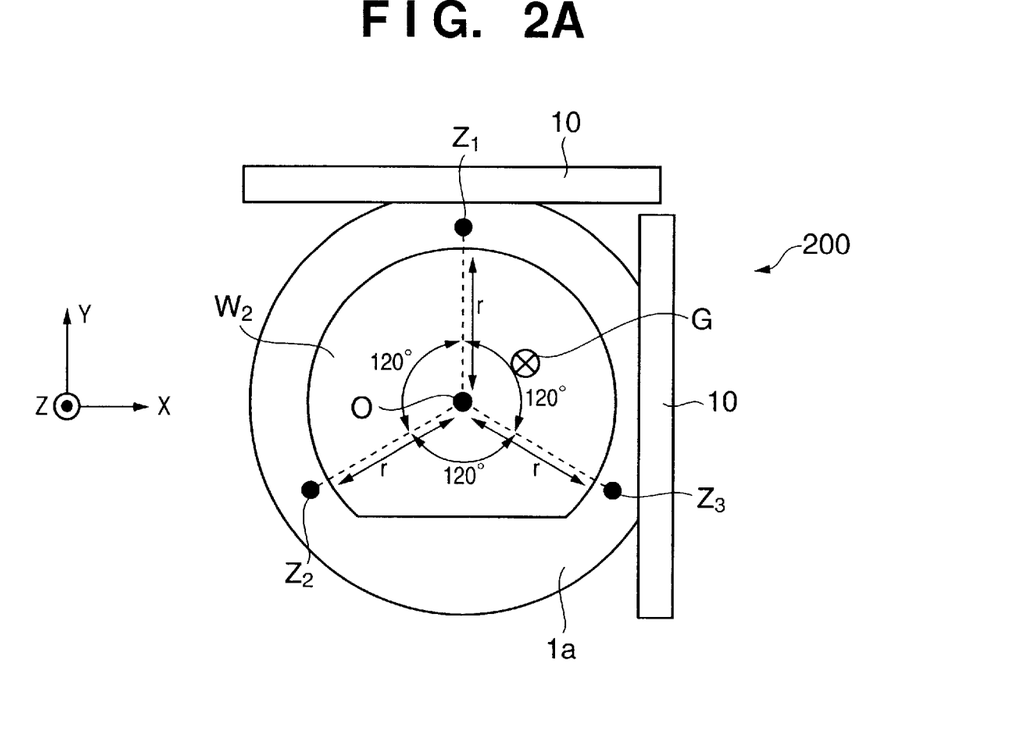
FIGS. 2A and 2B are a plan view and sectional view, respectively, showing a stage apparatus according to the second embodiment of the present invention.
Figure 2B:
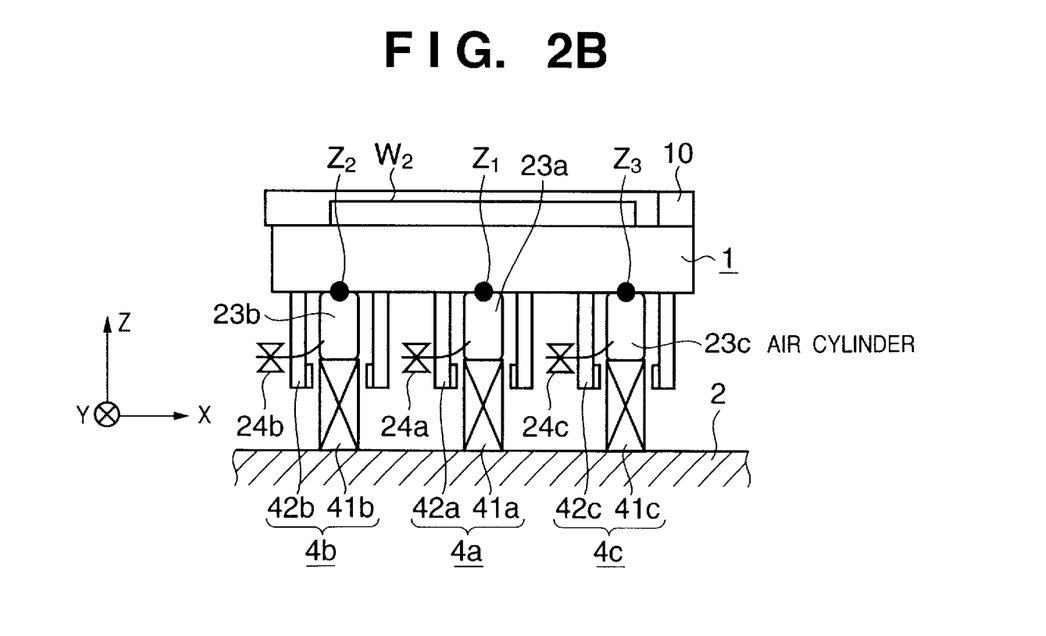

FIGS. 2A and 2B show the stage apparatus of an exposure apparatus according to the second embodiment of the present invention. A stage apparatus 200 uses first to third air cylinders 23a to 23c, instead of the first to third spring members 3a to 3c in the first embodiment. Pressure control mechanisms 24a to 24c control the pressures of the air cylinders 23a to 23c so as to push up a fine moving stage 1 by the air cylinders 23a to 23c and move up a wafer W2 near to the image plane. The fine moving stage 1, a coarse moving stage 2, linear motors 4a to 4c, and bar mirrors 10 are the same as those of the first embodiment. The same reference numerals denote the same parts, and a description thereof will be omitted.

A method of calculating the ratio of the pressures of the air cylinders 23a to 23c that correspond to spring constants is the same as that of calculating the ratio of the spring constants of the spring members in the first embodiment.

The first to third air cylinders 23a to 23c operate similarly to three spring members such as coil springs having different spring constants.

Also in the second embodiment, the linear motors 4a to 4c of the fine moving stage 1 suffice to generate a force against a moment force caused by a deviation of the barycenter G from the geometrical center O during acceleration/deceleration of the coarse moving stage 2. Compared to gravity compensation by Lorentz force, the amount of heat generated by the linear motors 4a to 4c can be greatly suppressed.

According to the second embodiment, scoring of or damage to the stage, which occurs in the prior art, can be prevented even if an external force acts on the fine moving stage owing to some factor while the servomotor of the fine moving stage fails, or even if position control stops due to an emergency stop while the fine moving stage is pushed down in the Z direction by position control of the linear motor in wafer exchange or the like.

Even when part or all of weight compensation of the fine moving stage is done by using permanent magnets or electromagnets as magnetic means together with spring members and/or air cylinders, the ratio of spring constants or the like is set based on the barycentric position of the fine moving stage similarly to the above-described embodiment, thus stabilizing the fine moving stage and preventing any damage or the like.

Figure 6:
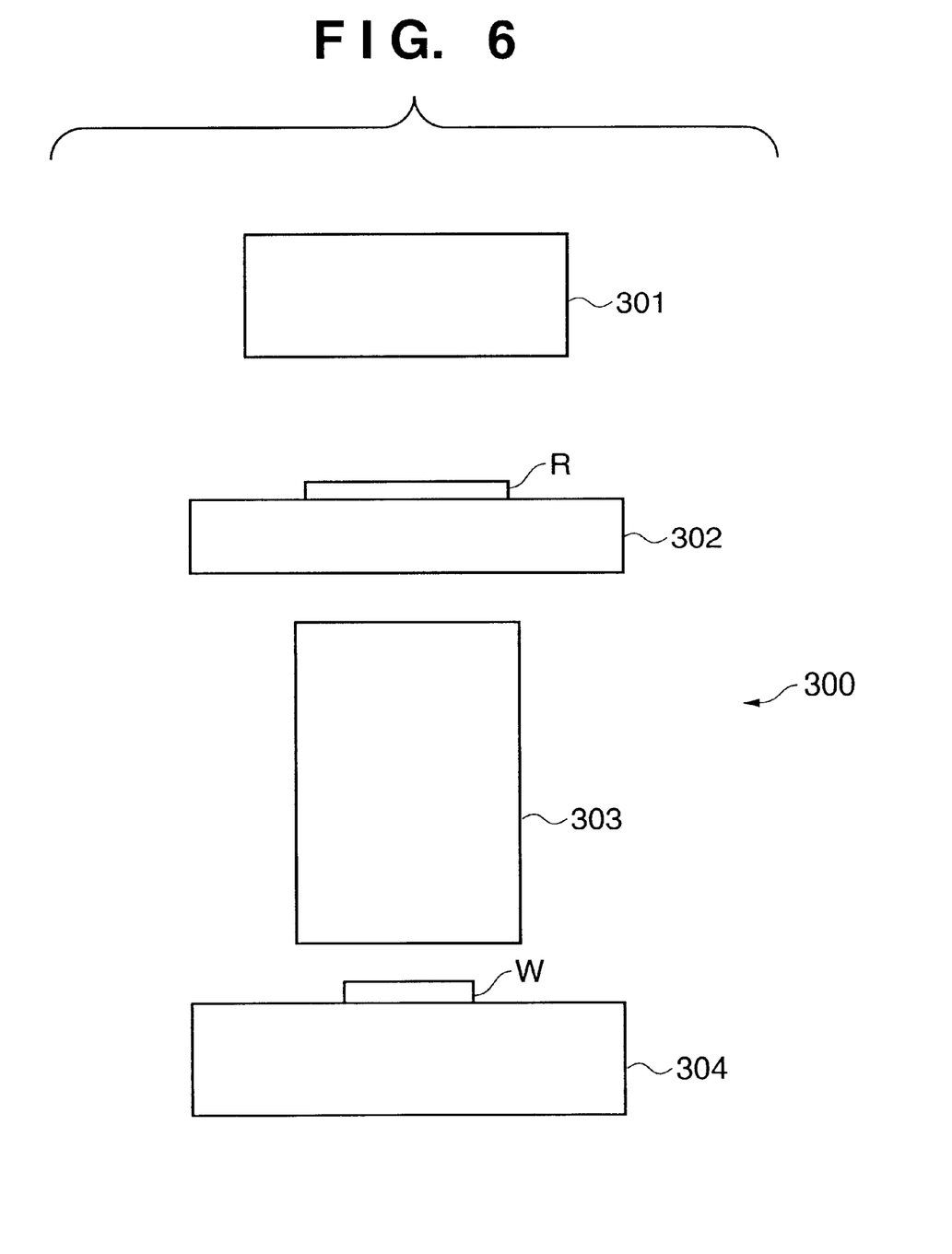
FIG. 6 is a view schematically showing an exposure apparatus according to a preferred embodiment of the present invention.

FIG. 6 shows the schematic arrangement of an exposure apparatus according to a preferred embodiment of the present invention that incorporates a stage apparatus represented by the first and second embodiments. An exposure apparatus 300 comprises an illumination system 301 for illuminating a reticle (master) R, a reticle stage (master stage) 302, a reduction projection system 303 for reducing and projecting the pattern of the reticle (master) R onto a wafer (substrate) W, and a wafer stage (substrate stage) 304. At least one of the reticle stage 302 and wafer stage 304 can be a stage apparatus represented by the first and second embodiments. The exposure apparatus may transfer a pattern onto a wafer (substrate) with a beam or X-ray, or may draw or transfer a pattern onto a wafer (substrate) with a charged-particle beam such as an electron beam. The latter type of exposure apparatus includes an apparatus which uses a master and an apparatus which does not use a master (controls irradiation with a charged-particle beam by a blanker or the like).

Figure 3:
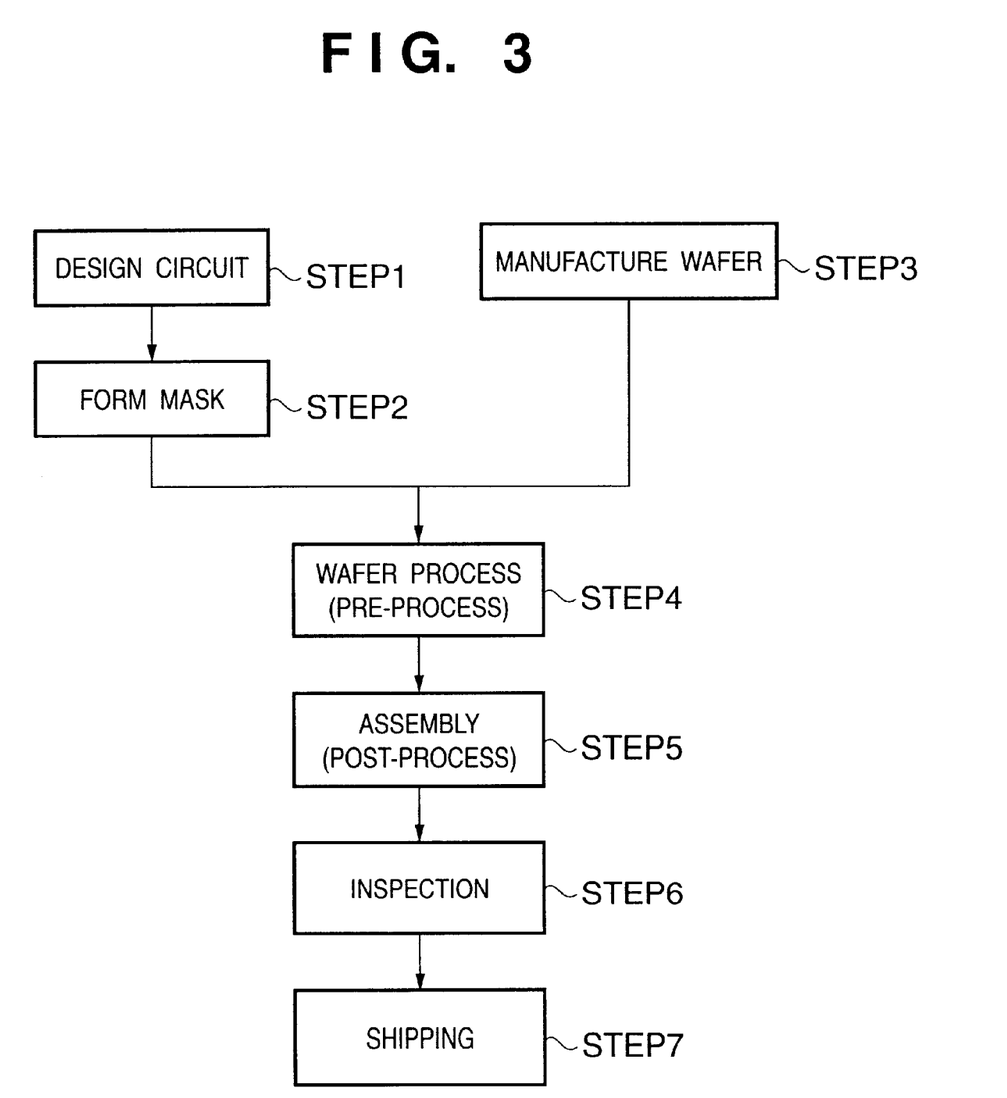
FIG. 3 is a flow chart showing a semiconductor manufacturing process.

An embodiment of a device manufacturing process using the exposure apparatus shown in FIG. 6 will be explained. FIG. 3 shows the manufacturing flow of a semiconductor device (semiconductor chip such as an IC or LSI, liquid crystal panel, CCD, or the like). In step 1 (circuit design), a semiconductor device circuit is designed. In step 2 (mask formation), a mask (reticle) having the designed circuit pattern is formed. In step 3 (wafer manufacture), a wafer as a substrate is manufactured by using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7).

Figure 4:
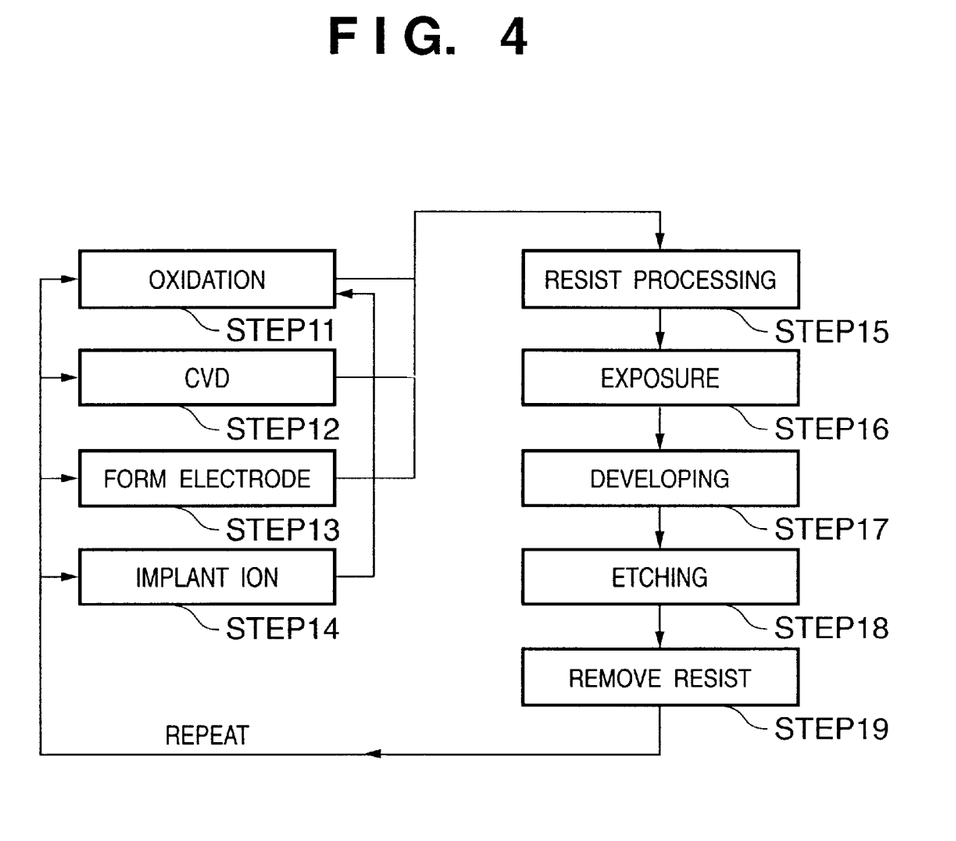
FIG. 4 is a flow chart showing a wafer process.

FIG. 4 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed by the above-described substrate processing method. These steps are repeated to form multiple circuit patterns on the wafer. The manufacturing method of this embodiment can manufacture a highly integrated semiconductor device which is conventionally difficult to manufacture.

The preferred embodiments of the present invention can realize a stable fine moving stage in which the weight of the fine moving stage is compensated for by using, e.g., at least three spring members, the driving amount of the linear motors as actuators using Lorentz force is reduced, heat generation is suppressed to avoid a decrease in exposure precision or the like caused by thermal deformation, generation of a rotation moment by the restoring forces of the springs is prevented, and trouble such as scoring and damage can be prevented at the stop of stage position control.

As many apparently widely different embodiments of the present invention can be made without departing from the spirit and scope thereof, it is to be understood that the invention is not limited to the specific embodiments thereof except as defined in the claims.

What is claimed is:

1. A stage apparatus comprising:
   a stage;
   a member fixed to said stage; and
   a weight compensation mechanism having at least three spring members for compensating for a weight of a structure including said stage and said member, a barycentric position of the structure deviating from a centroid of a polygon formed by support points of the at least three spring members,
   wherein spring constants of the at least three spring members are determined based on a relative positional relationship between the barycentric position of the structure and the at least three spring members so as to set at least one spring constant different from the other spring constants.

2. The apparatus according to claim 1, wherein the at least three spring members include coil springs.

3. The apparatus according to claim 1, wherein the at least three spring members include air cylinders.

4. The apparatus according to claim 1, wherein the at least three spring members include leaf springs.

5. The apparatus according to claim 1, wherein said weight compensation mechanism further includes a magnet.

6. The apparatus according to claim 1, further comprising an actuator for vertically driving said stage.

7. The apparatus according to claim 6, wherein said actuator includes a linear motor.

8. The apparatus according to claim 6, further comprising at least three actuators for vertically driving said stage, wherein a supporting force generated by each of the spring members and applied to said stage and a driving force generated by each of the actuators and applied to said stage are exerted on the same axis.

9. The apparatus according to claim 1, wherein said member includes a mirror.

10. The apparatus according to claim 1, wherein the at least three spring members are arranged at positions a constant distance from the geometrical center of said stage.

11. The apparatus according to claim 1, wherein the at least three spring members include n spring members, and the n spring members are arranged at vertexes of a regular n-side polygon having the geometrical center of said stage as a center.

12. A stage apparatus comprising:
    a stage;
    a member fixed to said stage; and
    a weight compensation mechanism having at least three spring members for compensating for a weight of a structure including said stage and said member, a barycentric position of the structure deviating from a centroid of a polygon formed by support points of the at least three spring members,
    wherein spring constants of the at least three spring members are determined to make application points of restoring forces of the at least three spring members coincide with the barycentric position of the structure when said stage is statically balanced.

13. A stage apparatus comprising:
    a coarse moving stage;
    a fine moving stage mounted on said coarse moving stage;
    a member fixed to said fine moving stage; and
    a weight compensation mechanism which has at least three spring members for compensating for a weight of a structure including said fine moving stage and said member, and is interposed between said coarse moving stage and said fine moving stage, a barycentric position of the structure deviating from a centroid of a polygon formed by support points of the at least three spring members,
    wherein spring constants of the at least three spring members are determined based on a relative position relationship between the barycentric position of the structure and the at least three spring members so as to set at least one spring constant different from the other spring constants.

14. A stage apparatus comprising:
    a coarse moving stage;
    a fine moving stage mounted on said coarse moving stage;
    a member fixed to said fine moving stage; and
    a weight compensation mechanism which has at least three spring members for compensating for a weight of a structure including said fine moving stage and said member and is interposed between said coarse moving stage and said fine moving stage, a barycentric position of the structure deviating from a centroid of a polygon formed by support points of the at least three spring members, wherein spring constants of the at least three spring members are determined to make application points of restoring forces of the at least three spring members coincide with the barycentric position of the structure when said stage is statically balanced.

15. An exposure apparatus comprising:
an illumination system for illuminating a master;
a master stage apparatus which moves while supporting the master;
a projection optical system for projecting a pattern of the master onto a substrate;
at least one of said master and substrate stage apparatuses having
a stage,
a member fixed to said stage, and
a weight compensation mechanism having at least three spring members for compensating for a weight of a structure including said stage and said member, a barycentric position of the structure deviating from a centroid of a polygon formed by support points of the at least three spring members,
wherein spring constants of the at least three spring members are determined based on a relative positional relationship between the barycentric position of the structure and the at least three spring members so as to set at least one spring constant different from the other spring constants.

16. An exposure apparatus comprising:
an illumination system for illuminating a master;
a master stage apparatus which moves while supporting the master;
a projection optical system for projecting a pattern of the master onto a substrate; and
a substrate stage apparatus which moves while supporting the substrate,
at least one of said master and substrate stage apparatuses having
a stage,
a member fixed to said stage, and
a weight compensation mechanism having at least three spring members for compensating for a weight of a structure including said stage and said member, a barycentric position of the structure deviating from a centroid of a polygon formed by support points of the at least three spring members,
wherein spring constants of the at least three spring members are determined to make application points of restoring forces of the at least three spring members coincide with the barycentric position of the structure when said stage is statically balanced.

17. An exposure apparatus comprising:
a projection optical system for projecting an image onto a substrate; and
a substrate stage apparatus which moves while supporting the substrate,
said substrate stage apparatus having
a stage,
a member fixed to said stage, and
a weight compensation mechanism having at least three spring members for compensating for a weight of a structure including said stage and said member, a barycentric position of the structure deviating from a centroid of a polygon formed by support points of the at least three spring members,
wherein spring constants of the at least three spring members are determined based on a relative positional relationship between the barycentric position of the structure and the at least three spring members so as to set at least one spring constant different from the other spring constants.

18. An exposure apparatus comprising:
a projection optical system for projecting an image onto a substrate; and
a substrate stage apparatus which moves while supporting the substrate,
said substrate stage apparatus having
a stage,
a member fixed to said stage, and
a weight compensation mechanism having at least three spring members for compensating for a weight of a structure including said stage and said member, a barycentric position of the structure deviating from a centroid of a polygon formed by support points of the at least three spring members,
wherein spring constants of the at least three spring members are determined to make application points of restoring forces of the at least three spring members coincide with the barycentric position of the structure when said stage is statically balanced.

19. A device manufacturing method comprising the steps of:
exposing a photosensitive agent on a substrate by using an exposure apparatus; and
developing the photosensitive agent on the substrate,
the exposure apparatus having
an illumination system for illuminating a master,
a master stage apparatus which moves while supporting the master,
a projection optical system for projecting a pattern of the master onto a substrate, and
a substrate stage apparatus which moves while supporting the substrate,
at least one of the master and substrate stage apparatuses having
a stage,
a member fixed to the stage, and
a weight compensation mechanism having at least three spring members for compensating for a weight of a structure including the stage and the member, a barycentric position of the structure deviating from a centroid of a polygon formed by support points of the at least three spring members,
wherein spring constants of the at least three spring members are determined based on a relative positional relationship between the barycentric position of the structure and the at least three spring members so as to set at least one spring constant different from other spring constants.

20. A device manufacturing method comprising the steps of:
exposing a photosensitive agent on a substrate by using an exposure apparatus; and
developing the photosensitive agent on the substrate,
the exposure apparatus having
an illumination system for illuminating a master,
a master stage apparatus which moves while supporting the master,
a projection optical system for projecting a pattern of the master onto a substrate, and
a substrate stage apparatus which moves while supporting the substrate, at least one of the master and substrate stage apparatuses having
a stage,
a member fixed to the stage, and
a weight compensation mechanism having at least three spring members for compensating for a weight of a structure including the stage and the member, a barycentric position of the structure deviating from a centroid of a polygon formed by support points of the at least three spring members,
wherein spring constants of the at least three spring members are determined to make application points of restoring forces of the at least three spring members coincide with the barycentric position of the structure when the stage is statically balanced.

21. A device manufacturing method comprising the steps of:
exposing a photosensitive agent on a substrate by using an exposure apparatus; and
developing the photosensitive agent on the substrate,
the exposure apparatus having
a projection optical system for projecting an image onto a substrate, and
a substrate stage apparatus which moves while supporting the substrate,
the substrate stage apparatus having
a stage,
a member fixed to the stage, and
a weight compensation mechanism having at least three spring members for compensating for a weight of a structure including the stage and the member, a barycentric position of the structure deviating from a centroid of a polygon formed by support points of the at least three spring members,
wherein spring constants of the at least three spring members are determined based on a relative positional relationship between the barycentric position of the structure and the at least three spring members so as to set at least one spring constant different from other spring constants.

22. A device manufacturing method comprising the steps of:
exposing a photosensitive agent on a substrate by using an exposure apparatus; and
developing the photosensitive agent on the substrate,
the exposure apparatus having
a projection optical system for projecting an image onto a substrate, and
a substrate stage apparatus which moves while supporting the substrate,
the substrate stage apparatus having
a stage,
a member fixed to the stage, and
a weight compensation mechanism having at least three spring members for compensating for a weight of a structure including the stage and the member, a barycentric position of the structure deviating from-a centroid of a polygon formed by support points of the at least three spring members,
wherein spring constants of the at least three spring members are determined to make application points of restoring forces of the at least three spring members coincide with the barycentric position of the structure when the stage is statically balanced.

23. A moving apparatus comprising:
a movable member which moves in at least a vertical direction; and
at least three spring members for compensating for a weight of the movable member, a barycentric position of the movable member deviating from a centroid of a polygon defined by support points if the at least three spring members.
wherein a spring constant of a first spring member located at a position near the barycentric position is larger than that of a second spring member located at a position farther from the barycentric position than the first spring member.

24. The apparatus according to claim 23, wherein the at least three spring members include at least one of one of coil springs, air springs and leaf springs.

25. The apparatus according to claim 23, wherein a sum of restoring forces of the at least three spring members acts on the movable member such that no rotational moment is generated on the movable member when the movable member statically displaces in the vertical direction.

26. The apparatus according to claim 23, wherein a sum of restoring forces of the at least three spring members acts on the barycentric position of the movable member when the movable member statically displaces in the vertical direction.

27. The apparatus according to claim 23, wherein a spring constant of the spring member is increased as a distance between a position of the spring member and the barycentric position of the movable member decreases.

28. The apparatus according to claim 23, wherein the movable member includes:
a stage having a support surface for supporting an object; and
a reflection member which is used together with an interferometer for detecting a position of the stage,
wherein the stage is moved in a direction other than the vertical direction by a moving mechanism and position information detected by using the interferometer and the reflection member is fed back to the moving mechanism.

29. The apparatus according to claim 28, wherein the moving mechanism includes at least three linear motors for moving the stage in the vertical direction, in addition to a mechanism for moving the stage in a direction other than the vertical direction.

30. The apparatus according to claim 28, wherein the object includes a wafer, a pattern of a mask being projected through a projection optical system onto the wafer supported by the stage to expose the wafer with the pattern.

31. The apparatus according to claim 28, wherein the object includes a mask, a pattern of the mask supported by the stage being projected through a projection optical system onto a wafer to expose the wafer with the pattern.

32. A device of manufacturing method comprising:
projecting a pattern of a mask onto a photosensitive agent on a wafer to expose the photosensitive agent with the pattern using an exposure apparatus, wherein the exposure apparatus comprises the moving apparatus of claim 30; and
developing the photosensitive agent of the wafer.

33. A device manufacturing method comprising:
projecting a pattern of a mask onto a photosensitive agent on a wafer to expose the photosensitive agent with the pattern using an exposure apparatus, wherein the exposure apparatus comprises the moving apparatus of claim 31; and developing the photosensitive agent on the wafer.

34. The apparatus according to claim 1, wherein the polygon comprises a triangle.

35. The apparatus according to claim 12, wherein the polygon comprises a triangle.

36. The apparatus according to claim 13, wherein the polygon comprises a triangle.

37. The apparatus according to claim 14, wherein the polygon comprises a triangle.

38. The apparatus according to claim 15, wherein the polygon comprises a triangle.

39. The apparatus according to claim 16, wherein the polygon comprises a triangle.

40. The apparatus according to claim 17, wherein the polygon comprises a triangle.

41. The apparatus according to claim 18, wherein the polygon comprises a triangle.

42. The apparatus according to claim 19, wherein the polygon comprises a triangle.

43. The apparatus according to claim 20, wherein the polygon comprises a triangle.

44. The apparatus according to claim 21, wherein the polygon comprises a triangle.

45. The apparatus according to claim 22, wherein the polygon comprises a triangle.

46. The apparatus according to claim 23, wherein the polygon comprises a triangle.

* * * * *

UNITED STATES PATENT AND TRADEMARK OFFICE
CERTIFICATE OF CORRECTION

PATENT NO.    : 6,504,599 B2  
DATED         : January 7, 2003  
INVENTOR(S)   : Mikio Sato It is certified that error appears in the above-identified patent and that said Letters Patent is hereby corrected as shown below:

Column 1,  
Line 42, "Especially" should read -- Especially, --.

Column 2,  
Line 7, "WO," should read -- W0, --.

Column 6,  
Line 47, "position" should read -- positional --.

Column 7,  
Line 38, "position" should read -- positional --.

Column 15,  
Line 62, "from-a" should read -- from a --.

Column 16,  
Line 57, "of" should be deleted.

Signed and Sealed this

Twenty-first Day of October, 2003

JAMES E. ROGAN  
*Director of the United States Patent and Trademark Office*